US007185226B2

(12) United States Patent
Chen et al.

(10) Patent No.: US 7,185,226 B2
(45) Date of Patent: Feb. 27, 2007

(54) FAULT TOLERANCE IN A SUPERCOMPUTER THROUGH DYNAMIC REPARTITIONING

(75) Inventors: Dong Chen, Croton On Hudson, NY (US); Paul W. Coteus, Yorktown Heights, NY (US); Alan G. Gara, Mount Kisco, NY (US); Todd E. Takken, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 522 days.

(21) Appl. No.: 10/469,002

(22) PCT Filed: Feb. 25, 2002

(86) PCT No.: PCT/US02/05566

§ 371 (c)(1),
(2), (4) Date: Aug. 22, 2003

(87) PCT Pub. No.: WO02/069469

PCT Pub. Date: Sep. 6, 2002

(65) Prior Publication Data

US 2004/0153754 A1 Aug. 5, 2004

Related U.S. Application Data

(60) Provisional application No. 60/271,124, filed on Feb. 24, 2001.

(51) Int. Cl.
*G06F 11/20* (2006.01)
*G06F 11/00* (2006.01)
(52) U.S. Cl. .......................... 714/13; 714/10; 712/12; 712/15
(58) Field of Classification Search .................. 714/13
See application file for complete search history.

(56) References Cited

U.S. PATENT DOCUMENTS

| 5,594,918 | A | * | 1/1997 | Knowles et al. ............... 712/15 |
| 5,963,746 | A | * | 10/1999 | Barker et al. .................. 712/20 |
| 6,002,851 | A | * | 12/1999 | Basavaiah et al. ............. 714/4 |
| 6,115,829 | A | * | 9/2000 | Slegel et al. .................. 714/10 |
| 6,567,909 | B2 | * | 5/2003 | Tsuruta et al. ................ 712/15 |
| 6,681,316 | B1 | * | 1/2004 | Clermidy et al. ............. 712/11 |
| 6,789,213 | B2 | * | 9/2004 | Kumar et al. ................. 714/13 |
| 2001/0018733 | A1 | * | 8/2001 | Fujii et al. ..................... 712/16 |
| 2003/0191855 | A1 | * | 10/2003 | Lee et al. .................... 709/239 |

(Continued)

FOREIGN PATENT DOCUMENTS

JP 61-201365 9/1986

(Continued)

*Primary Examiner*—Scott Baderman
*Assistant Examiner*—Joseph Schell
(74) *Attorney, Agent, or Firm*—Scully, Scott, Murphy & Presser, P.C.; Daniel P. Morris, Esq.

(57) ABSTRACT

A multiprocessor, parallel computer is made tolerant to hardware failures by providing extra groups of redundant standby processors and by designing the system so that these extra groups of processors can be swapped with any group which experiences a hardware failure. This swapping can be under software control, thereby permitting the entire computer to sustain a hardware failure but, after swapping in the standby processors, to still appear to software as a pristine, fully functioning system.

13 Claims, 6 Drawing Sheets

U.S. PATENT DOCUMENTS

2004/0128474 A1 * 7/2004 Vorbach .................. 712/10

FOREIGN PATENT DOCUMENTS

| JP | 62-274454 | 11/1987 |
|----|-----------|---------|
| JP | 03-132861 | 6/1991 |
| JP | 06-035872 | 2/1994 |
| JP | 06-290158 | 10/1994 |

* cited by examiner

FAULT TOLERANCE IN A SUPERCOMPUTER THROUGH DYNAMIC REPARTITIONING

CROSS-REFERENCE

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States Patent Applications filed on even date herewith, the entire contents and disclosure of each of which is expressly incorporated by reference herein as if fully set forth herein. PCT patent application US02\05618, for "Class Networking Routing"; PCT patent application US02\05586, for "A Global Tree Network for Computing Structures"; PCT patent application US02\05567, for 'Global Interrupt and Barrier Networks"; PCT patent application US02\05569 for 'Optimized Scalable Network Switch"; PCT patent application US02\05618, for "Arithmetic Functions in Torus and Tree Networks"; PCT patent application US02\05568, for 'Data Capture Technique for High Speed Signaling"; PCT patent application US02\05587, for 'Managing Coherence Via Put/Get Windows'; PCT patent application US02\05575, for "Low Latency Memory Access And Synchronization"; PCT patent application US02\05614, for 'Twin-Tailed Fail-Over for Fileservers Maintaining Full Performance in the Presence of Failure"; PCT patent application US02\05572, for "Fault Isolaton Through No-Overhead Link Level Checksums'; PCT patent application US02\05570, for "Ethernet Addressing Via Physical Location for Massively Parallel Systems"; U.S. patent application Ser. No. 10/258,515, for "Checkpointing Filesystems"; PCT patent application US02\05574, for "Efficient Implementation of Multidimensional Fast Fourier Transform on a Distributed-Memory Parallel Multi-Node Computer"; PCT patent application US02\05571, for "A Novel Massively Parallel Supercomputer"; and U.S. patent application Ser. No. 10/083,270, for "Smart Fan Modules and System".

This invention was made with Government support under subcontract number B517552 under prime contract number W-7405-ENG-48 awarded by the Department of Energy. The Government has certain rights in this invention.

BACKGROUND OF THE INVENTION

1. Field of the Invention

The present invention relates generally to the provision of fault tolerance in a parallel computer's interconnection networks by software controlled dynamic repartitioning.

2. Discussion of the Prior Art

A large class of important computations can be performed by massively parallel computer systems. Such systems consist of many identical compute nodes, each of which typically consist of one or more CPUs, memory, and one or more network interfaces to connect it with other nodes.

The computer described in related U.S. provisional application Ser. No. 60/271,124, filed Feb. 24, 2001, for A Massively Parallel Supercomputer, leverages system-on-a-chip (SOC) technology to create a scalable cost-efficient computing system with high throughput. SOC technology has made it feasible to build an entire multiprocessor node on a single chip using libraries of embedded components, including CPU cores with integrated, first-level caches. Such packaging greatly reduces the component count of a node, allowing for the creation of a reliable, large-scale machine.

SUMMARY OF THE INVENTION

The present invention provides fault tolerance in a supercomputer through dynamic repartitioning. A multiprocessor, parallel computer is made tolerant to hardware failures by providing extra groups of redundant standby processors and by designing the system so that these extra groups of processors can be swapped with any group which experiences a hardware failure. This swapping can be under software control, thereby permitting the entire computer to sustain a hardware failure but, after swapping in the standby processors, to still appear to software as a pristine, fully functioning system.

BRIEF DESCRIPTION OF THE DRAWINGS

The foregoing objects and advantages of the present invention for the provision of fault tolerance in a supercomputer through dynamic repartitioning may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

The massively parallel Supercomputer described in U.S. provisional application Ser. No. 60/271,124 describes a massively parallel computer having (x, y, z) (wherein x=64, y=32, z=32) compute nodes connected by several separate communication networks. The first of these networks is a three dimensional (3D) torus, in which each compute node connects by 6 links in the + and −x, y, z directions to its 6 logically adjacent nearest neighbor compute nodes, and each compute node has 6 bidirectional torus ports.

The massively parallel supercomputer comprises 64×32×32 compute nodes, wherein each compute node includes an ASIC with 2 processors, one processor of which performs processing as part of the massively parallel supercomputer, and the second processor performs message passing operations.

Figure 4:
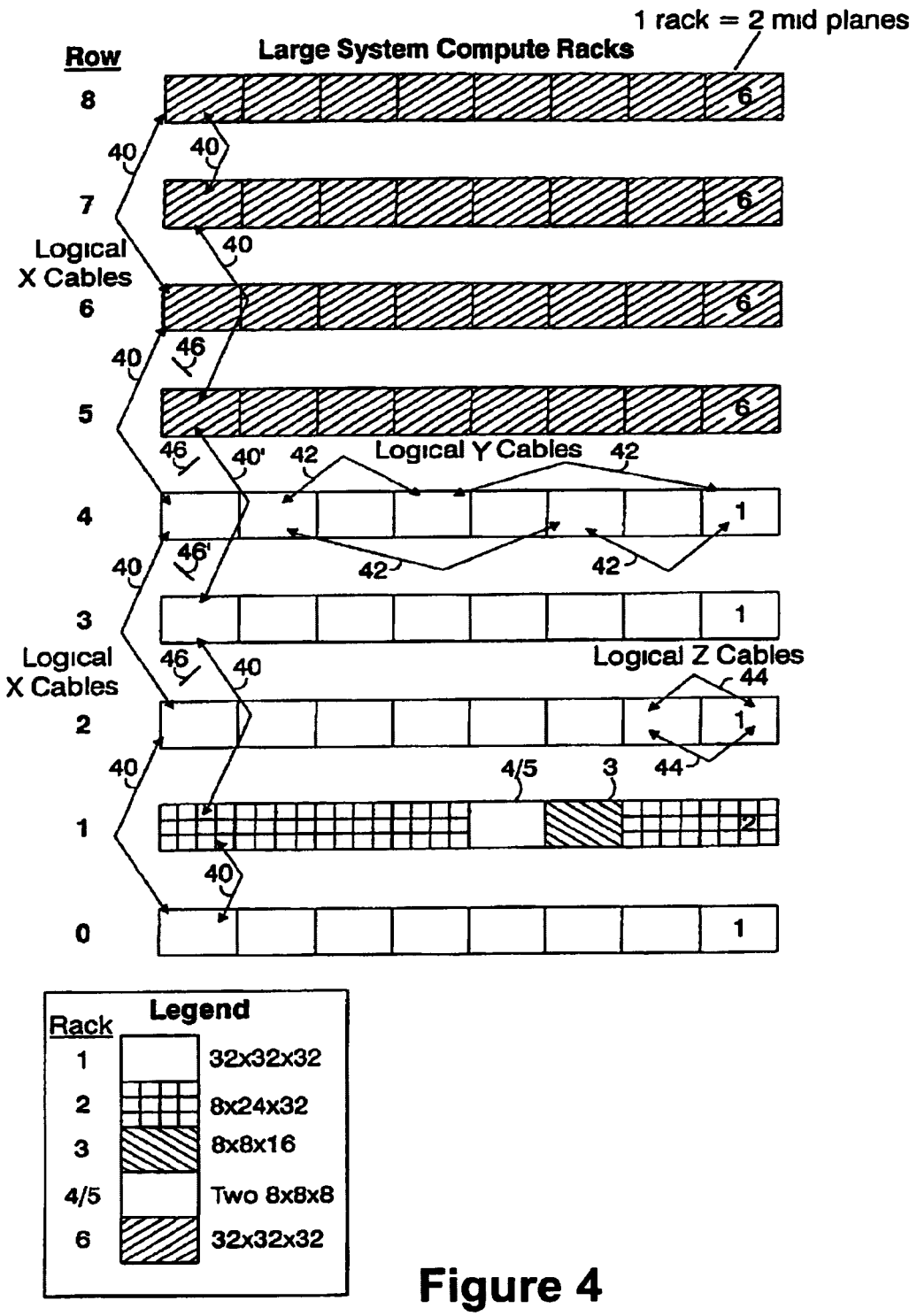
FIG. 4 can be viewed conceptually as a floor plan of the massively parallel supercomputer and illustrates 9 rows of 8 compute racks separated by 8 aisles, wherein each of the 8 racks in each row contains 2 midplanes, and each midplane contains 8×8×8 compute nodes.

FIG. 4 can be viewed conceptually as a floor plan of the massively parallel supercomputer and illustrates 9 rows of compute racks separated by 8 aisles to facilitate service. Each of the 9 racks in each row is about the size of a refrigerator and contains 2 midplanes. Each midplane is a basic building block and contains 8×8×8 compute nodes, wherein each compute node comprises a multiprocessor as explained above.

The physical machine architecture is most closely tied to a 3D torus. This is a simple 3-dimensional nearest neighbor interconnect which is "wrapped" at the edges. All 6 nearest torus neighbors are equally distant, except for time-of-flight differences such as exist between different racks of compute node ASICs, making code easy to write and optimize. Each node therefore supports 6 independent bidirectional nearest neighbor links.

Figure 1:
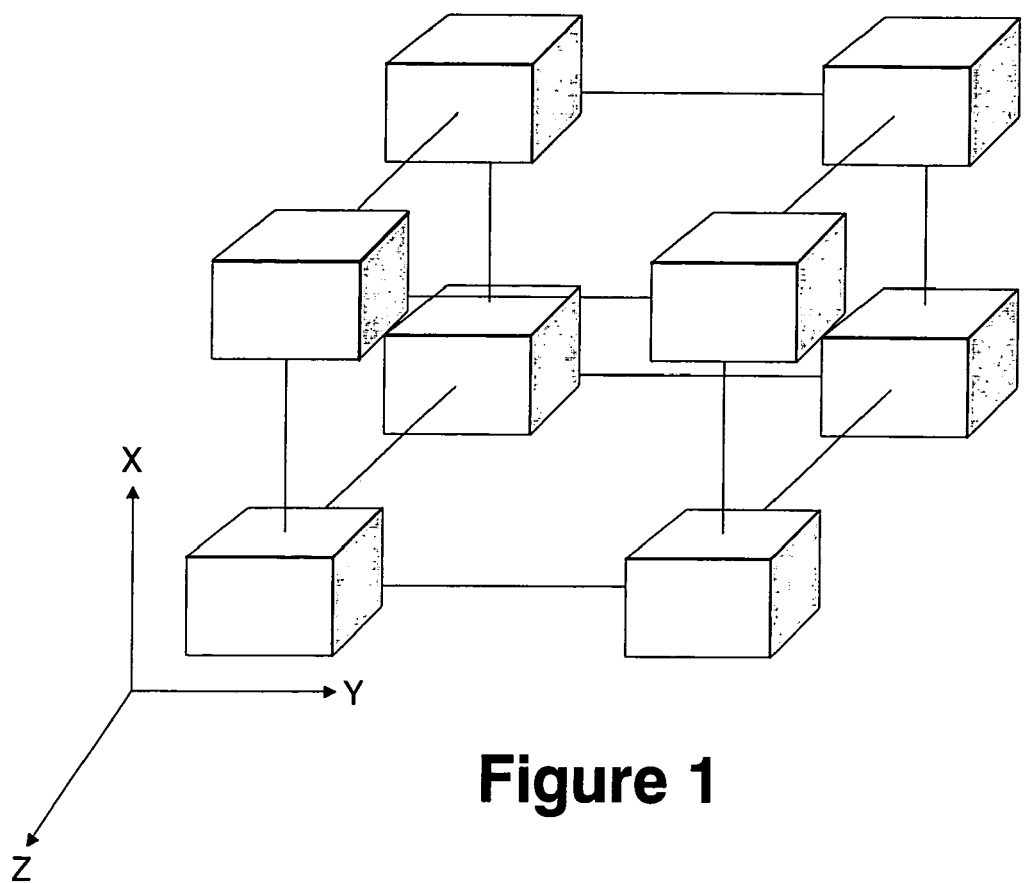
FIG. 1 illustrates a very simplified 8 node section of a parallel computer and the torus links between those 8 nodes. It is a partial illustration of the torus links of a full array of nodes wherein each node actually has 6 torus links in + and −x, y, z directions, and the links wrap in each logical direction (x, y or z) from the highest numbered node back to the lowest numbered node, so as to maintain 6 torus links in 6 directions for all nodes in the system.

FIG. 1 illustrates a very simplified view of 8 nodes of a parallel supercomputer's torus and the links between those 8 nodes, and is a partial illustration of a full array of nodes wherein each node actually has 6 torus links in + and −x, y, z directions. The links wrap in each logical direction (x, y or z) from the highest numbered node back to the lowest numbered node, so as to maintain 6 torus links in 6 directions for all nodes in the system. FIG. 1 also illustrates schematically an x, y, z coordinate system consistent with the x, y, z coordinate system of FIG. 4. The massively parallel supercomputer has compute circuit cards and link circuit cards which plug into the midplane. The circuit cards are wired in 2×2×2 sub-cubes while midplanes, two per rack, are wired as 8×8×8 sub-cubes. The operative 64 k machine is a 64×32×32 torus, although to provide redundancy to compensate for faulty components the machine is physically implemented as a 72×32×32 torus, wherein the additional 8×32×32 nodes are provided for redundancy purposes to provide extra groups of redundant standby processors.

Figure 2:
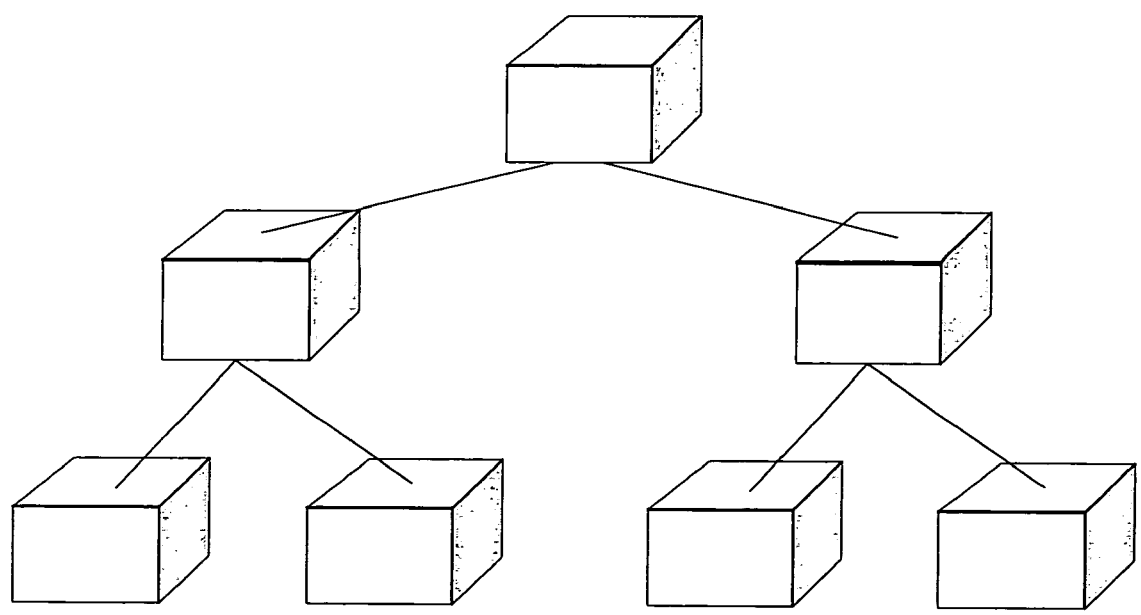
FIG. 2 is a very simplified illustration of a global combining tree of the massively parallel supercomputer, and is a partial illustration of a full global combining tree which connects all nodes over an entire partition of compute nodes.
Figure 6:
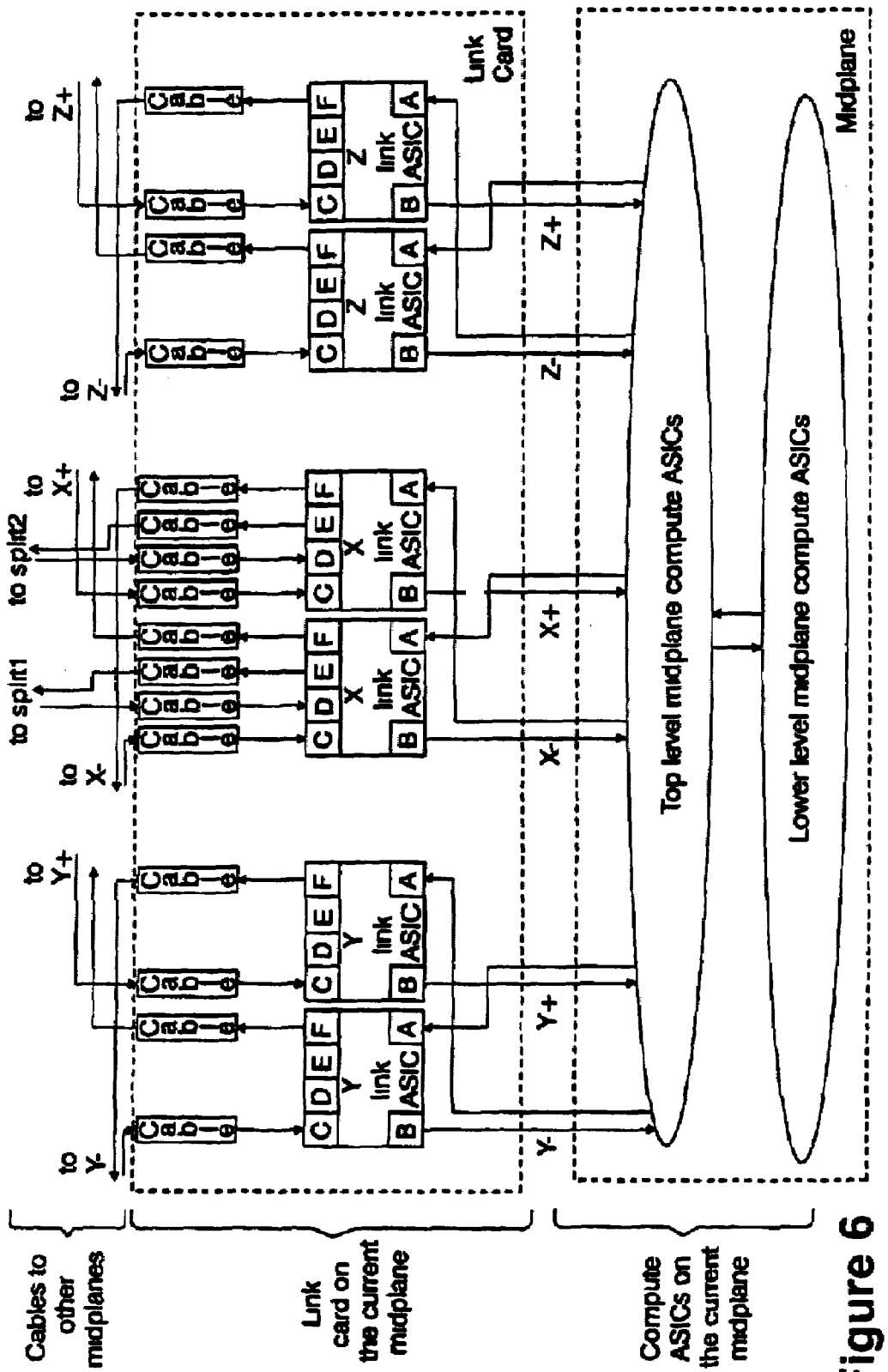
FIG. 6 illustrates the routing of global tree signals, which are the signals of the global combining tree network, into and out of a link card, though cables which connect to neighboring midplanes, through the link card, and then into and out of the midplane compute ASICs. The link ASICs and top level compute ASICs collectively determine how the tree on the current midplane is connected to the global combining tree in the larger system.
Figure 7:
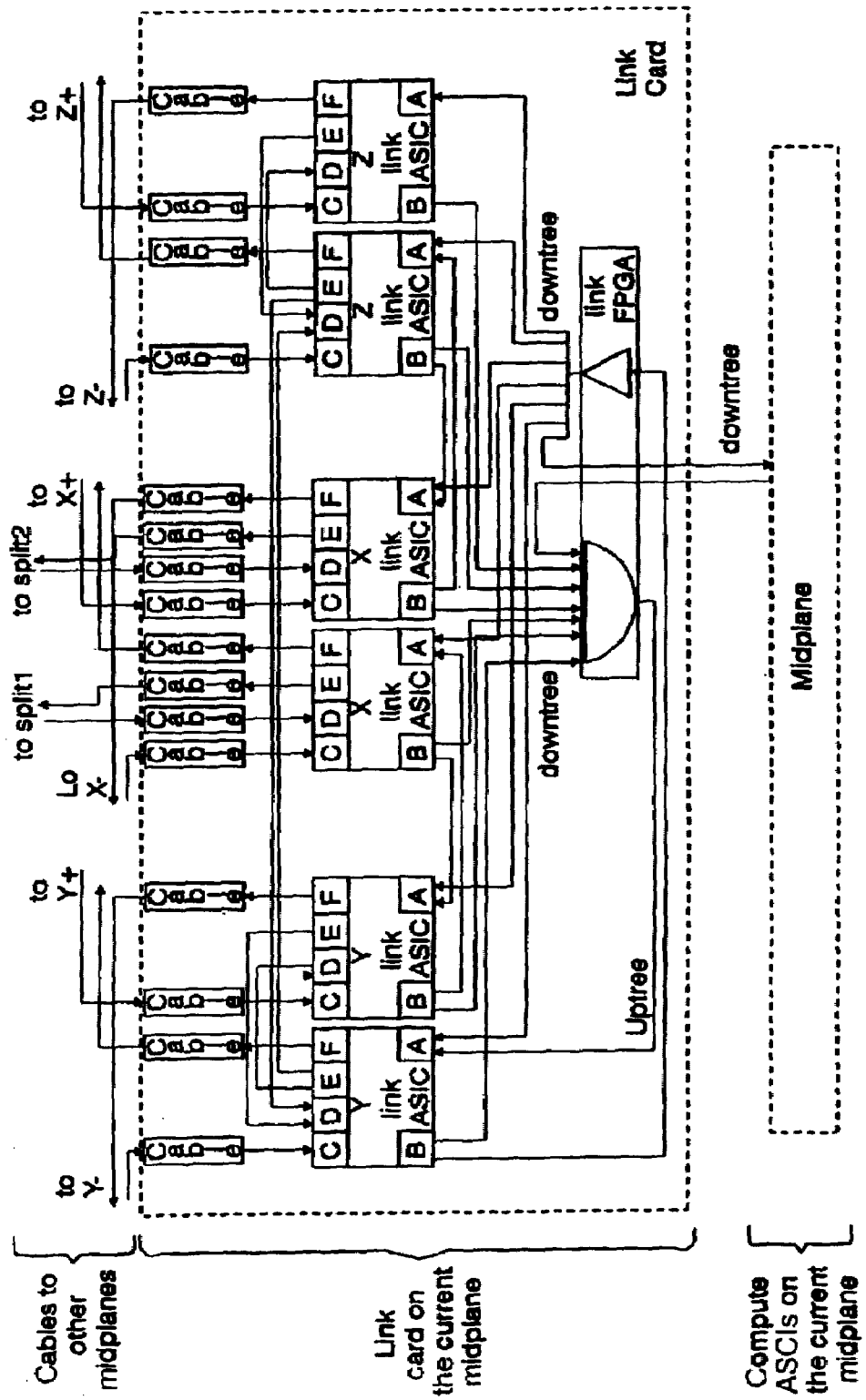
FIG. 7 illustrates the routing of interrupt signals, which are the signals of the global interrupt signal network, into and out of link card through cables which connect the neighboring midplanes, through the link card ASICs and FPGA and then into and out of the midplane.

In addition to the 6 torus links of each node to 6 nearest neighboring nodes, the massively parallel supercomputer includes two other completely separate communication link networks. The second communication link network is global combining tree of links, as illustrated in FIGS. 2 and 6. The third communication link network is a set of global interrupt signals, as illustrated in FIG. 7. The combining tree of links and the global interrupt signals are similar to each other in their tree structures and provide communication over an entire partition (64×32×32 compute nodes), of the machine, both of which are discussed below.

FIG. 2 is a very simplified illustration of a global combining tree of the massively parallel supercomputer which extends over the entire machine, allowing data to be sent from any node to all others (broadcast), or to a subset of nodes. Global sums, minimum and maximum can also be calculated. Message passing is supported on the global combining tree, and controlled by a second processor within each compute node, allowing intensive operations like all-to-all communications to proceed independent of the compute node.

Pursuant to the present invention a multiprocessor parallel computer is made tolerant to hardware failures by providing extra groups of redundant standby processors, and by designing the system so that these extra groups of processors can be swapped with any group which experiences a hardware failure. This swapping can be under software control, thereby permitting the entire computer to sustain a hardware failure but after swapping in the standby processors, to still appear to software as a pristine, fully functioning system.

System Repartitioning

In the massively parallel supercomputer described herein, three main separate interconnection networks can benefit from this dynamic repartitioning: a three dimensional torus, a global combining tree, and a set of global interrupts. The massively parallel supercomputer is organized into groups of 512 multiprocessors (8×8×8 nodes) per midplane, with link chips that steer signals over cables between midplanes. The link chips (6 chips per link circuit card) are the primary way by which software reconfiguration of the system is enabled.

The massively parallel supercomputer can be logically repartitioned by software control. This permits a large group of racks (as illustrated in FIG. 4), physically cabled together as one system, to be logically divided into multiple subsystems. Each of these logically separated subsystems can then simultaneously run different code, or some separated systems can be serviced while others compute. Logical repartitioning therefore facilitates code development and system maintenance.

Figure 3:
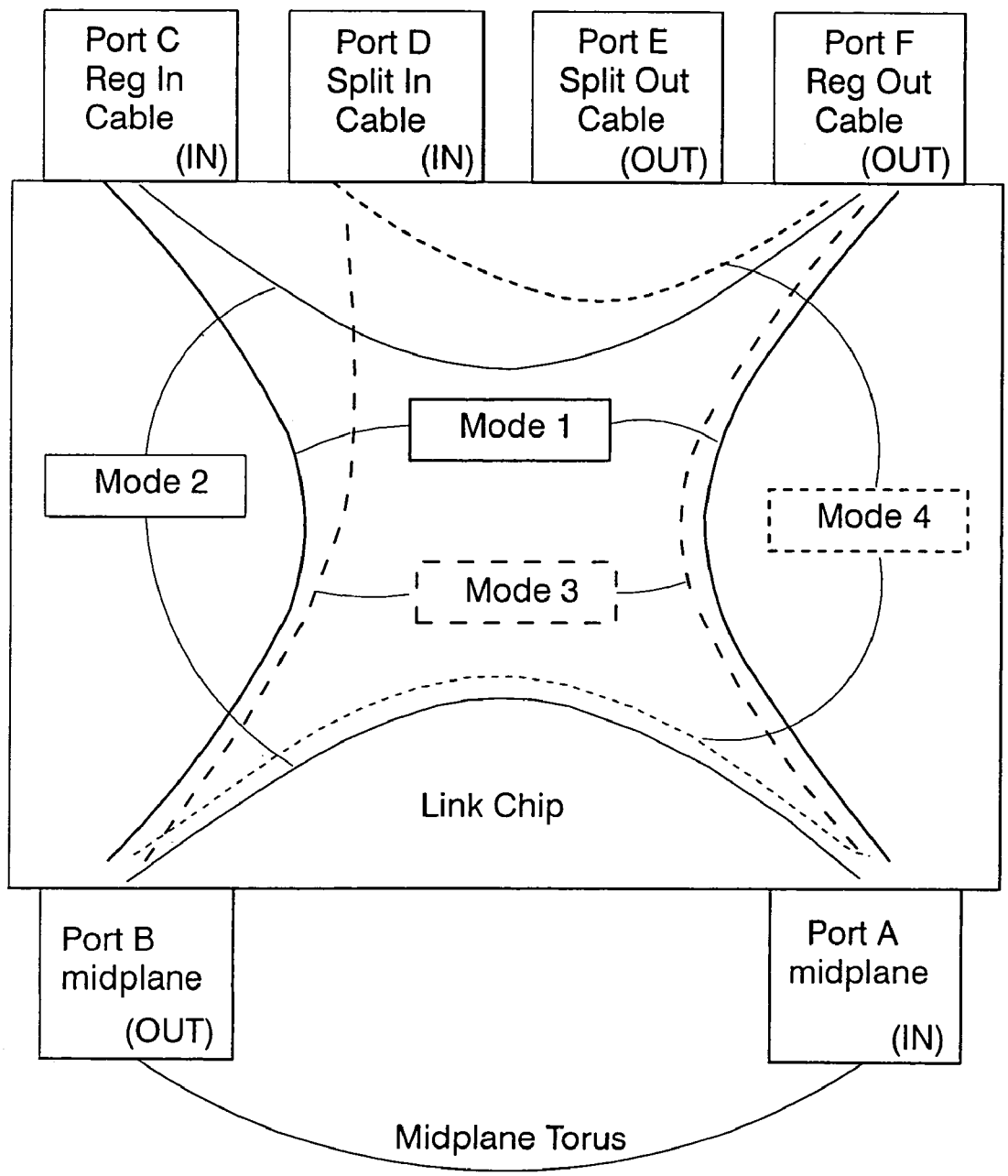
FIG. 3 illustrates the operation of the link chip which controls repartitioning.

FIG. 3 illustrates, and the following section explains, the operation of the link chip which controls repartitioning. The subsequent section details the types of subdivisions which are possible.

Link Chip

The massively parallel supercomputer's torus, global combining tree and global interrupt signals pass through the link chip when tracking between different midplanes. This chip serves two functions. First, it redrives signals over the cables between midplanes, improving the high speed signal shape and amplitude in the middle of a long, lossy trace-cable-trace connection between compute ASICs on different midplanes. Second, the link chip can redirect signals between its different ports. This redirection function is what enables the massively parallel supercomputer to be dynamically repartitioned into multiple, logically separate systems.

The link chip performs two types of torus signal redirection for system repartitioning, called regular redirection and split redirection.

Regular Redirection

Figure 5:
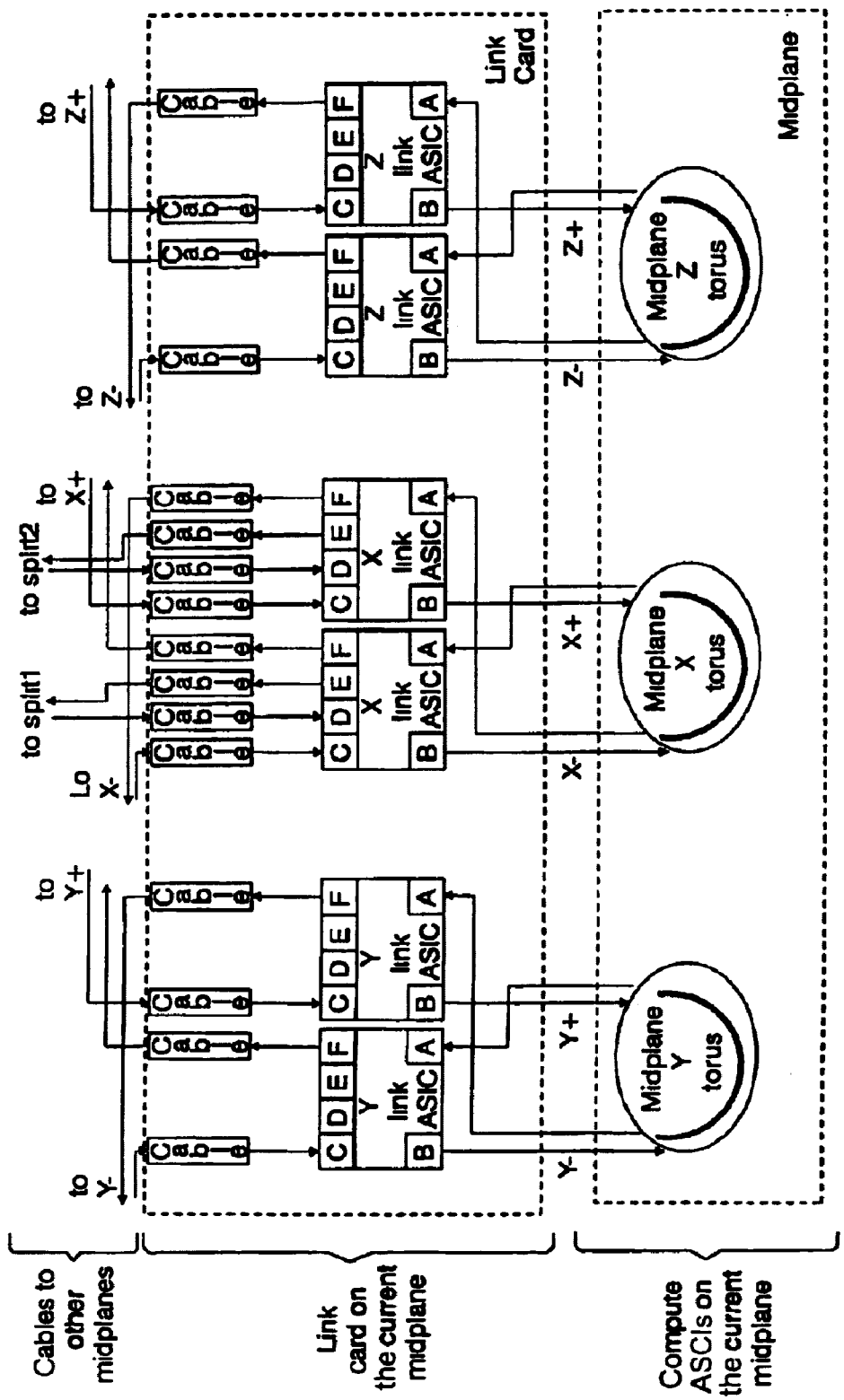
FIG. 5 illustrates the routing of torus signal into and out of a link card through cables which connect to neighboring midplanes, through the link card, and then into and out of the torus on the current midplane. The link ASICs optionally connect the 3-dimensional 8×8×8 torus on the current midplane to the torus of the larger machine.

Regular redirection removes one midplane from one logical direction (along either of the x, y or z axes as illustrated in FIG. 4) of the large compute system. Regular redirection is shown in Modes 1 and 2 of FIG. 3. It involves ports C, F, A and B of the link chip. Ports C and F are attached to the plus direction and minus direction by cables between the current midplane and the higher or lower order midplane in a particular torus logical direction, x, y or z, as shown at the top of FIG. 5. These cable connections are show by the arrows in FIG. 4 labeled Logical X cables 40, Logical Y cables 42 and Logical Z cables 44. Ports A and B connect to a midplane torus loop which circles within the midplane through eight compute processors in series, as illustrated in FIG. 3, and also in FIG. 5 as midplane X torus 51, midplane Y torus 52 and midplane Z torus 53.

When operating in Mode 1, the link chip routes signals from the previous midplane through port C, through the current midplane, as illustrated by a midplane torus loop, and on to the next midplane through port F. It thereby makes the current midplane part of the larger compute system.

When operating in Mode 2, the cable signals from the previous midplane enter through port C and are passed directly to the next midplane through port F, removing the current midplane from the larger compute system. Also in Mode 2, torus signals on the current midplane are connected to and loop within the midplane through ports A and B, creating a smaller compute system.

Split Redirection

Split redirection permits dividing a large 64×32×32 node section of the machine into two equal 32×32×32 halves or four 16×32×32 quarters. As implemented in the link chip, split redirection could permit a great variety of system divisions. However, due to cost and signal integrity concerns on long cables, split redirection is only physically cabled in the logical X direction and only on the number of rack rows (FIG. 4) necessary to permit dividing the large system into two equal halves or four quarters. Split redirection is shown in Modes 3 and 4 of FIG. 3. Eight Modes, 3 through 10, are necessary to accomplish split redirection, though only two, Modes 3 and 4 are shown in FIG. 3, for purposes of illustration, and the remaining modes operate in an analogous manner. In split redirection the link chip redefines the cable parts which it considers to be the plus or minus cable directions to neighboring midplanes. It either redefines the plus direction port from the regular port C to split port D or E, or it redefines the minus direction port from the regular port F to the split port D or E or both. The regular cables are shown by the thin lines with arrows (logical x cables 40, logical y cables 42, and logical z cables 44)in FIG. 4, and the split cables 46 are shown as fat lines without arrows (near the center of logical x cables). The logical x cables extend along the x direction, and similarly for the logical y cables in the y direction and the logical z cables in the z direction.

FIG. 4 illustrates how the Logical X cables are connected between racks. The row numbers are indicated by numbers 0–8 on the left. Note that the Logical x cables are often connected to every other row, with cables between rows 0–2, 1–3, 2–4, 3–5, etc. except for the ends with one cable 0-1 and one cable 7-8. These cables allow a connection of a midplane to a neighboring midplane along the x axis without any one cable being unduly long. Similar cable connection schemes can be employed along the y and z axes.

The split cables enable x-dimension torus connections other than along the regular logical x cables. For instance, if the machine were being divided into two smaller machines, with a first machine having rows 0–4 and a second machine having rows 5–8, then split cable 46' could be switched in place of logical cable 40', so that the x cables for the first machine are now 0-2, 2-4, 4-3, 3-1 and 1-0, and the second machine could be switched in a similar manner.

Torus Partitioning

FIG. 4 illustrates the massively parallel supercomputer cabling and partitioning.

Logical repartitioning enables a range of options for how the machine can be subdivided. FIG. 4 illustrates examples of both regular and split partitioning, and shows how a midplane can be isolated from the system for service.

Split partitioning can divide the large 72×32×32 cabled massively parallel supercomputer into two subsystems of approximately equal halves, a 40×32×32 subsystem, and a 32×32×32 subsystem. This can be done in one of two ways, to ensure that two 32×32×32 subsystems can always be created when a midplane is malfunctioning, independent of where that midplane is physically located (by using the split cables 46 in the manner as explained above under Split redirection). Either the 40×32×32 subsystem is the top five rows of racks and the 32×32×32 subsystem is the bottom four rows, or the reverse. For example, if a midplane in row 1 in the rack indicated by square 4/5 in FIG. 4 needs servicing, then a split partition can be used to divide the system between the top four rows of racks and the bottom five rows. In this case the bottom five rows numbered 0, 1, 2, 3 and 4 form one 40×32×32 subsystem and the top four rows 5, 6, 7 and 8 (all having racks numbered 6 designing system partition #6) form a separate 32×32×32 subsystem. Both subsystems can be operated in these sizes, or they can be further subdivided using regular partitioning.

Regular partitioning can isolate one 1-midplane (8-node) long section from any logical torus direction. If a midplane in the 4/5 rack of row 1 in FIG. 4 is malfunctioning, then regular partitioning can be used to isolate row 1 in the logical x direction from the rest of the 40×32×32 lower system, creating the 32×32×32 system labeled 1 in rows 0, 2, 3 and 4 (system #1) and an 8×32×32 system in row 1 whose racks are labeled with numbers 2, 3 and 4/5. Regular partitioning of this 8×32×32 section in row 1 in the logical y direction isolates the 3 and 4/5 racks from the 2 racks, giving a 8×24×32 section (2 racks, system #2) and an 8×8×32 section (3 and 4/5 racks). Twice regular partitioning of the 8×8×32 section in the logical z direction isolates the 4/5 rack and the 3 rack, resulting in an 8×8×16 section (2 rack, system #3) and two 8×8×8 sections (4/5 racks, systems #4 and #5), one of which can be serviced while all other subdivisions compute. Similar partitioning can be used in different combinations to subdivide and isolate different subsections.

FIG. 5 illustrates the routing of torus signals into and out of a link card through cables which connect to neighboring midplanes, through the link card, and then into and out of the torus on the current midplane. The link ASICs optionally connect the 3-dimensional 8×8×8 torus on the current midplane to the torus of the larger machine. At the top of FIG. 5, the + and −x, y, and z signals are coupled to respectively the + and −logical x cables 40, logical y cables 42, and logical z cables 44 of FIG. 4. The signals to and from "to split 1" and "to split 2" in the x direction in FIG. 5 are coupled to the + and split cables 46 of FIG. 4. As explained above, the split cables 46 are only provided along the x direction, although in more complex embodiments they could also be provided along the y and z directions. The link card includes + and −ASICs for each of the x, y and z directions, which operate as explained above with reference to FIG. 3.

Tree and Interrupt Repartitioning

The global combining tree and global interrupt signals are routed through the same link chips and cables as the torus signals, as can be seen by comparing the top sections of FIGS. 5, 6 and 7. Regular and split repartitioning therefore break the tree into logical subpartitions in exactly the same way as the torus. Within a logical sub-partition the I/O processors on each midplane are then software reconfigured to connect the tree within the partition.

FIGS. 6 and 7 illustrate the routing of global combining tree and global interrupt signals through cables and link chips (with x, y, z link chips being illustrated) between midplanes which also carry the torus signals. When the link chips are reconfigured, this sets which midplanes are connected in each of the system's logical partitions. However, upon repartitioning, the combining tree network and the interrupt signal network both need to be further configured so that the head of the combining tree and the head of the interrupt signal network are both defined throughout each logical machine partition. This can be accomplished in many ways.

FIG. 6 illustrates the routing of global tree signals, which are the signals of the global combining tree network, which are routed over precisely the same cables as the torus signals of FIG. 5.

For the global combining tree, the massively parallel supercomputer uses a group of top-level midplane compute processors (ASICs) on each midplane to collectively define which of the six off-midplane cable directions (signals through link chips) to neighboring midplanes are defined as up-tree (from a perspective view, towards the top of the tree of FIG. 2), or traveling to a higher logical level in the tree, and which are defined as down-tree (from a perspective view, towards the bottom of the tree of FIG. 2). These top level midplane ASICs have three global tree ports each, and the ports can be switched under software control to define which ports are up-tree and down-tree. Collectively these top level midplane ASICs define one of the six off-midplane cable links as up-tree and the other five as down-tree, and they provide a tree connection for the other lower level midplane ASICs, as shown in FIG. 6.

FIG. 7 illustrates the routing of interrupt signals, which are the signals of the global interrupt signal network, which are also routed over precisely the same cables as the torus signals of FIG. 5.

Since the interrupts are simple AND and OR functions, the complex processors of the midplane compute ASICs are not required to perform arithmetic operations when connecting multiple down-tree branches to an up-tree link. A group of top level compute ASICs is not needed to connect the interupt network's off-midplane up-tree and down-tree links. The interrupt routing of FIG. 7 can thereby be simplified compared to the global tree routing of FIG. 6. For the global interrupts the link chips in FIG. 7 communicate between themselves over lines 54 and together present a single bidirectional up-tree signal over lines 55 to a link FPGA (ASICs Floating Point Gate Array) on the link card. This FPGA can perform down-tree broadcasts and up-tree AND and OR logic functions. It communicates down-tree signals over the five down-tree cable connections and into the midplane.

FIGS. 5, 6 and 7 illustrate that the routing of all of the torus signals, the global tree signals, and the interrupt signals between the cables and the link card is precisely the same. All three network travel over the same cables, and each link card handles the routing and repartitioning of all three types of signals for all three types of networks.

While several embodiments and variations of the present invention for a fault tolerance in a supercomputer through dynamic repartitioning are described in detail herein, it should be apparent that the disclosure and teachings of the present invention will suggest many alternative designs to those skilled in the art.

Having thus described our invention, what we claim as new and desire to secure by Letters Patent is:

1. A method of providing fault tolerance in a parallel computer system which includes a plurality of parallel processors to render the computer system tolerant to hardware failures comprising:

providing the computer system with extra groups of redundant standby processors, said computer system comprising an array of a×b×c compute nodes connected as a three dimensional torus wherein each compute node connects by 6 links, including wrap links, in the + and −x, y, z directions to 6 adjacent compute nodes, and further including communication links over a global combining tree of links, and a similar combining tree for a set of global interrupt signals; and, designing the computer system so that the extra groups of redundant standby processors can be switched to operate in place of a group of processors of the computer system which experiences a hardware failure, wherein the computer system's torus, global combining tree, and global interrupt signals pass through a link chip which redirects signals between different ports of the link chip to enable the computer system to be partitioned into multiple, logically separate systems.

2. The method of claim 1, wherein the switching is under software control, thereby permitting the entire computer system to sustain a hardware failure, and after switching in of the standby processors, the computer system appears to software as a fully functioning and operative computer system.

3. The method of claim 1, wherein the computer system comprises a massively parallel computer system comprising a plurality of substantially identical compute nodes, each of which comprises one or more CPUs, memory, and one or more network interfaces to connect it with other compute nodes.

4. The method of claim 1, wherein each compute node includes an ASIC with a multiprocessor, one processor of which performs processing as part of the massively parallel supercomputer, and a second processor which performs message passing operations of the compute node.

5. The method of claim 1, wherein the link chip also serves a second function of redriving signals over the cables between midplanes.

6. The method of claim 1, wherein the global combining tree and global control signals are routed through the same link chip and links as signals that are routed through said three dimensional torus, such that regular and split redirection and repartitioning change the global combining free of links into logical subpartitions in exactly the same way as the three dimensional torus.

7. The method of claim 6, wherein upon repartitioning, the global combining tree and interrupt signals are further configured so that the head of the combining free and the head of the global interrupt signals are both defined throughout each logical machine partition.

8. A method of providing fault tolerance in a parallel computer system which includes a plurality of parallel processors to render the computer system tolerant to hardware failures comprising:

providing the computer system with extra groups of redundant standby processors, said computer system comprising an array of a×b×c compute nodes connected as a three dimensional torus wherein each compute node connects by 6 links, including wrap links, in the + and −x, y, z directions to 6 adjacent compute nodes, and further including communication links over a global combining tree of links, and a similar combining tree for a set of global interrupt signals; and, designing the computer system so that the extra groups of redundant standby processors can be switched to operate in place of a group of processors of the computer system which experiences a hardware failure, wherein a link chip performs two types of signal redirection: regular redirection which removes one midplane from one logical direction along either of the x, y, or z axes of the computer system, and split redirection which permits dividing the computer system into two halves or four quarters.

9. The method of claim 8, wherein the switching is under software control, thereby permitting the entire computer system to sustain a hardware failure, and after switching in of the standby processors, the computer system appears to software as a fully functioning and operative computer system.

10. The method of claim 8, wherein the computer system comprises a massively parallel computer system comprising a plurality of substantially identical compute nodes, each of which comprises one or more CPUs, memory, and one or more network interfaces to connect it with other compute nodes.

11. The method of claim 8, wherein each compute node includes an ASIC with a multiprocessor, one processor of which performs processing as part of the massively parallel supercomputer, and a second processor which performs message passing operations of the compute node.

12. The method of claim 8, wherein the global combining free and global control signals are routed through the same link chip and links as signals that are routed through said three dimensional torus, such that regular and split redirection and repartitioning change the global combining tree of links into logical subpartitions in exactly the same way as the three dimensional torus.

13. The method of claim 12, wherein upon repartitioning, the global combining tree and interrupt signals are further configured so that the head of the combining tree and the head of the global interrupt signals are both defined throughout each logical machine partition.

* * * * *